US009792998B1

(12) United States Patent
Yang et al.

(10) Patent No.: US 9,792,998 B1
(45) Date of Patent: Oct. 17, 2017

(54) SYSTEM AND METHOD FOR ERASE DETECTION BEFORE PROGRAMMING OF A STORAGE DEVICE

(71) Applicant: SanDisk Technologies, Inc., Plano, TX (US)

(72) Inventors: Nian Niles Yang, Mountain View, CA (US); Chris Yip, Saratoga, CA (US); Grishma Shah, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/084,100

(22) Filed: Mar. 29, 2016

(51) Int. Cl.
  *G11C 16/10* (2006.01)
  *G11C 16/34* (2006.01)

(52) U.S. Cl.
  CPC ................. *G11C 16/3431* (2013.01)

(58) Field of Classification Search
  CPC ...................................... G11C 16/10
  USPC ...................................... 365/185.03
  See application file for complete search history.

(56) References Cited

U.S. PATENT DOCUMENTS

| 2009/0067266 | A1* | 3/2009 | Roohparvar | G11C 16/20 365/189.16 |
| 2011/0013450 | A1* | 1/2011 | Murin | G11C 11/5628 365/185.03 |
| 2012/0102259 | A1* | 4/2012 | Goss | G11C 7/04 711/103 |
| 2012/0127799 | A1* | 5/2012 | Bellorado | G11C 16/12 365/185.18 |
| 2012/0155168 | A1* | 6/2012 | Kim | G11C 5/14 365/185.03 |
| 2012/0239991 | A1 | 9/2012 | Melik-Martirosian | |
| 2013/0073924 | A1* | 3/2013 | D'Abreu | G06F 11/1048 714/763 |
| 2014/0029350 | A1 | 1/2014 | Mu et al. | |
| 2014/0173382 | A1 | 6/2014 | Yang et al. | |
| 2014/0219032 | A1* | 8/2014 | Moschiano | G11C 16/10 365/185.19 |

(Continued)

OTHER PUBLICATIONS

International Search Report for corresponding International Appln. No. PCT/US2017/018806 dated May 31, 2017; 4 pages.

(Continued)

*Primary Examiner* — Min Huang
(74) *Attorney, Agent, or Firm* — Brinks Gilson & Lione

(57) ABSTRACT

Systems and methods for detecting program disturb and for programming/reading based on the detected program disturb are disclosed. Program disturb comprises unintentionally programming an unselected section of memory during the program operation of the selected section of memory. To reduce the effect of program disturb, the section of memory is analyzed in a predetermined state (such as the erase state) for program disturb. In response to identifying signs of program disturb, the voltages used to program the section of memory (such as the program verify levels for programming data into the cells of the section of memory) may be adjusted. Likewise, when reading data from the section of memory, the read voltages may be adjusted based on the adjusted voltages used for programming. In this way, using the adjusted programming and reading voltages, the effect of program disturb may be reduced.

21 Claims, 15 Drawing Sheets

(56) References Cited

U.S. PATENT DOCUMENTS

| | | | |
|---|---|---|---|
| 2014/0258646 A1* | 9/2014 | Goss | G06F 11/10 |
| | | | 711/154 |
| 2014/0334224 A1* | 11/2014 | Cordero | G11C 11/406 |
| | | | 365/149 |
| 2015/0049548 A1* | 2/2015 | Park | G11C 16/26 |
| | | | 365/185.11 |
| 2016/0005495 A1 | 1/2016 | Lasser | |

OTHER PUBLICATIONS

Written Opinion of the International Searching Authority corresponding to International Appln. No. PCT/US2017/018806 dated May 31, 2017; 7 pages.

* cited by examiner

Read Offset selection table based on PD offset

| Block ID | wordline zone PD offset on the PGMV (in DAC) | | | | |
| --- | --- | --- | --- | --- | --- |
| | Zone 0 | Zone 1 | Zone 2 | Zone 3 | Zone 4 |
| 0 | 0 | 5 | 7 | 9 | 11 |
| 1 | 0 | 4 | 5 | 7 | 9 |
| 2 | 0 | 3 | 5 | 7 | 9 |
| 3 | 0 | 4 | 6 | 8 | 10 |
| 4 | 0 | 5 | 7 | 9 | 11 |

FIG. 6

SYSTEM AND METHOD FOR ERASE DETECTION BEFORE PROGRAMMING OF A STORAGE DEVICE

TECHNICAL FIELD

This application relates generally to storage devices. More specifically, this application relates to a storage device that at least partly compensates for program disturbance.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor memory is widely used in various electronic devices such as mobile computing devices, mobile phones, solid-state drives, digital cameras, personal digital assistants, servers, and non-mobile computing devices. Semiconductor memory may comprise non-volatile memory or volatile memory. A non-volatile storage device allows information to be stored or retained even when the non-volatile storage device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile storage devices have been scaled in order to reduce the cost per bit. However, as process geometries shrink, many design and process challenges are presented. These challenges include increased variability in memory cell I-V characteristics and increased susceptibility to write or program disturbs, in which data stored in non-targeted memory cells (or unselected memory cells) may be corrupted due to programming operations being performed on targeted memory cells (or memory cells that have been selected for programming).

BRIEF DESCRIPTION OF THE DRAWINGS

The system may be better understood with reference to the following drawings and description. In the figures, like reference numerals designate corresponding parts throughout the different views.

FIG. 6 illustrates a table of program disturb compensation correlated between blocks and wordlines within respective blocks.

DETAILED DESCRIPTION

Figure 1A:
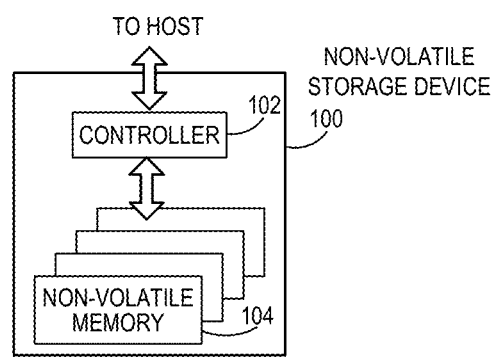
FIG. 1A is a block diagram of an example non-volatile memory system.

A storage device may include a storage device controller and memory. The memory may be in the form of one or more memory integrated circuit chips. The storage device controller may send commands to the memory integrated circuit chip(s) for execution. Examples of commands include a write command for writing data to the memory in the memory integrated circuit chip(s), a read command for reading data from the memory integrated circuit chip(s) and an erase command for erasing for memory in the memory integrated circuit chip(s). Other commands are contemplated.

When programming (or writing) data into memory (such as into a respective memory integrated circuit chip), the section of memory (such as a wordline) is selected for programming. In the process of programming the section of memory, program disturb may occur in an unselected section of memory. As one example, program disturb includes unintentionally programming an unselected section of memory during the program operation of the selected section of memory. In this regard, the unselected section of memory (e.g., another set of memory cells, another wordline, or the like) may experience voltage stress while a programming voltage is applied across the cells in the selected section of memory. The voltage stress may affect one or more aspects of the unselected section of memory. As one example, the voltage stress may cause the unselected section of memory's voltage threshold (Vt) to shift. Over many programming cycles, the accumulated shift in the Vt may result in data corruption.

In one embodiment, the operation of the storage device is modified based on a detected program disturb in a respective section of memory. In a first specific embodiment, the programming of data to the respective section of memory is adjusted based on the detected program disturb. In a second specific embodiment, the reading of data from the respective section of memory is adjusted based on the detected program disturb. As discussed in more detail below, the first specific embodiment may be practiced separate from the second specific embodiment. Alternatively, the first specific embodiment may be practiced in combination with the second specific embodiment.

With regard to writing (or programming) data to a respective section of memory, the controller may determine an indication of program disturb in the respective section of memory, and, based on the indication, adjust or modify the programming of data in the respective section of memory. Alternatively, another section of the storage device other than the controller may determine the indication and adjust or modify programming. For example, circuitry resident on the memory integrated circuit chips may perform this function. As discussed above, in various embodiments, the respective section of memory may comprise a unit of programming of the memory (such as a wordline), may comprise a sub-unit of programming of the memory (such as a section of cells within the wordline), and/or may comprise greater than a unit of programming of the memory.

In one embodiment, the controller may determine the indication of program disturb based on (or at least partly dependent on) the controller analyzing the respective section of memory in one or more phases or states of the respective section of memory, and based on the analysis, determine the indication of program disturb. As discussed in more detail below, the controller may analyze the respective section of memory (or a subsection of the memory) in the true erased state (e.g., after the section of memory has undergone an erase operation). Based on the analysis, the controller may determine an indication of program disturb. Alternatively, the controller may analyze the respective section of memory (or a subsection of the memory) in another state (such as after programming).

The controller may be triggered to perform the program disturb analysis of part or all of the section of memory in one of several ways. In one way, the controller may determine an age of the memory, and based on the age, be triggered to perform the program disturb analysis. As one example, the controller may determine the number of program/erase (P/E) count for the respective section of memory, and perform the program disturb analysis if the P/E count is equal to or greater than one or more thresholds. In particular, the controller may be programmed to perform the program disturb analysis in response to determining that the P/E count is equal to 100, 200, and/or 500. Alternatively, the controller may determine the number of program/erase (P/E) count for a different section of the memory, and perform the program disturb analysis for part or all sections of the memory if the P/E count in the different section of memory is equal to or greater than one or more thresholds. In particular, the controller may be programmed to perform the program disturb analysis for all blocks in the memory in response to the controller determining that any block in memory has the P/E count equal to 100, 200, and/or 500.

In an alternate embodiment, the controller may determine the indication of program disturb independent of and not based on any analysis of the section of memory. For example, the storage device may be pre-programmed with a table indicative of the indication of program disturb. In this regard, in one embodiment, the indication of program disturb is determined not based on any analysis of the state of the section of memory (such as the true erased state), but based on a pre-set indication that is pre-programmed upon manufacture of the storage device. For example, the number of the wordline for programming may be determined. The number of the wordline may be compared with one or more predetermined thresholds, and in response to determining that the number of the wordline is greater than a predetermined threshold, the indication of program disturb may be determined. As discussed in more detail below, a block may include 128 wordlines. The program disturb typically affects the higher number wordlines. In this regard, the controller may access a table that correlates zones or numbers of wordlines with indications of program disturb.

Responsive to determining the indication of program disturb (either dependent on or independent of analysis of the section of memory), one or more aspects of the programming of data into the section of memory may be adjusted. In one embodiment, the program verify voltage levels for programming data into the cells of the section of memory may be modified in order to at least partly reduce the effects of program disturb. Alternatively, other aspects of programming the data are adjusted to reduce (or eliminate) the effects of the program disturb.

In one specific implementation, before a new wordline is to be programmed, a true erase state check is performed. If the wordline is at the true erase state, the controller commands that the memory integrated circuit chip to program with the default programming condition. If the wordline is not at the true erase state (e.g., there is an indication of a certain level of program disturb), then the controller commands a change in at least one aspect of programming (e.g., adjust the program verify (PGMV) voltage levels to program the wordline slightly harder than the default programming condition to compensate for the program disturb). In one embodiment, the change of PGMV voltage levels may be dependent on the true erase check results of the wordline. For example, the more program disturb detected, the higher the PGMV voltage levels selected to program the wordline. Alternatively or in addition, if the program disturb is detected to be so strong that the programming cannot be executed, the wordline programming is abandoned and dummy data may be inserted in it (such as state B (discussed below in FIG. 4A), or higher). As discussed in more detail below, generally, the higher order wordlines will experience greater program disturb effects, in turn will likely have higher PGMV voltage levels, and thus their read voltage levels need to be accordingly adjusted for better reads.

With regard to reading data from a respective section of memory, the controller may determine an indication of program disturb in the respective section of memory, and, based on the indication, adjust or modify the reading of data from the respective section of memory. For example, the controller may determine the program voltages at which the wordline was programmed. As discussed above, the program voltages may be based on the program disturb of the wordline. Based on the determined program voltages, the wordline may be read.

Referring to the figures, FIG. 1A is a block diagram illustrating a non-volatile memory system. The non-volatile memory system 100 includes a controller 102 and non-volatile memory that may be made up of one or more non-volatile memory die 104. The non-volatile memory die may comprise one or more memory integrated circuit chips. One or both of the controller 102 and non-volatile memory die 104 may use a regulated voltage. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program (e.g., write), and erase operations to non-volatile memory die 104.

The controller 102 (which may in one embodiment be a flash memory controller) can take the form of processing circuitry, a microprocessor or processor, and a computer-readable medium that stores computer-readable program code (e.g., software or firmware) executable by the (micro)

processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. For example, the hardware and/or firmware may be configured for analysis of the incoming data stream (such as for bandwidth and/or consistency) and for determination whether to use hybrid blocks, as discussed in more detail below. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. One example of non-volatile memory die 104 may comprise a memory integrated circuit chip. The memory cells can take the form of solid-state (e.g., flash) memory cells and can be one-time programmable, few-time programmable, or many-time programmable. As discussed above, the memory cells can also be single-level cells (SLC), multiple-level cells (MLC), triple-level cells (TLC), quadruple-level cells (QLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although in the example illustrated in FIG. 1A non-volatile memory system 100 includes a single channel between controller 102 and non-volatile memory die 104, the subject matter described herein is not limited to having a single memory channel. For example, in some NAND memory system architectures such as illustrated in FIGS. 1B-C, 2, 4, 8 or more NAND channels may exist between the controller and the NAND storage device, depending on controller capabilities. In any of the embodiments described herein, more than a single channel may exist between the controller and the memory die, even if a single channel is shown in the drawings.

Figure 1B:
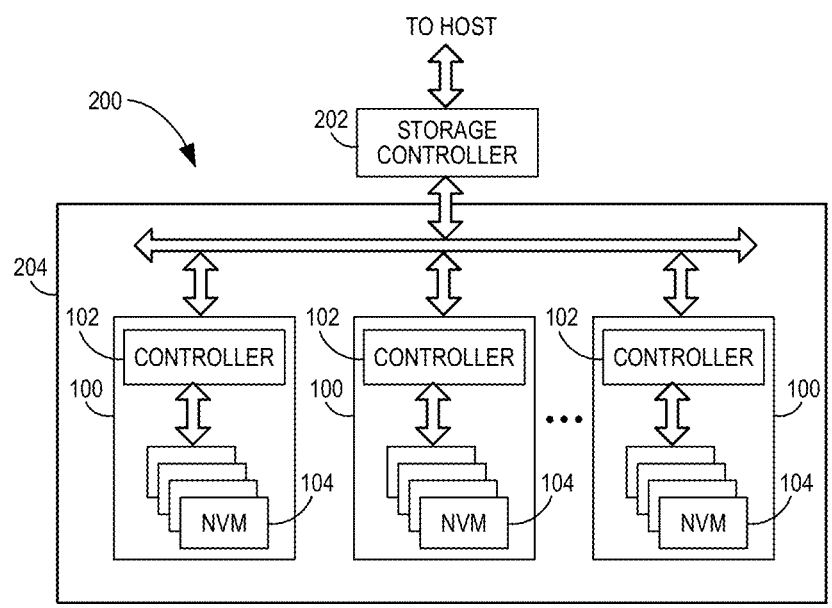
FIG. 1B is a block diagram illustrating an exemplary storage module.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
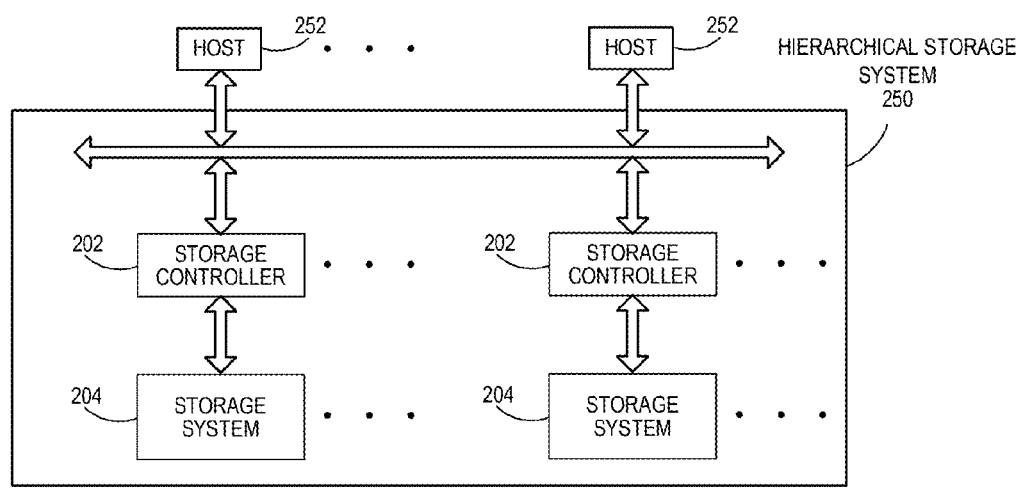
FIG. 1C is a block diagram illustrating a hierarchical storage system.

FIG. 1C is a block diagram illustrating a hierarchical storage system. A hierarchical storage system 210 includes a plurality of storage controllers 202, each of which controls a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
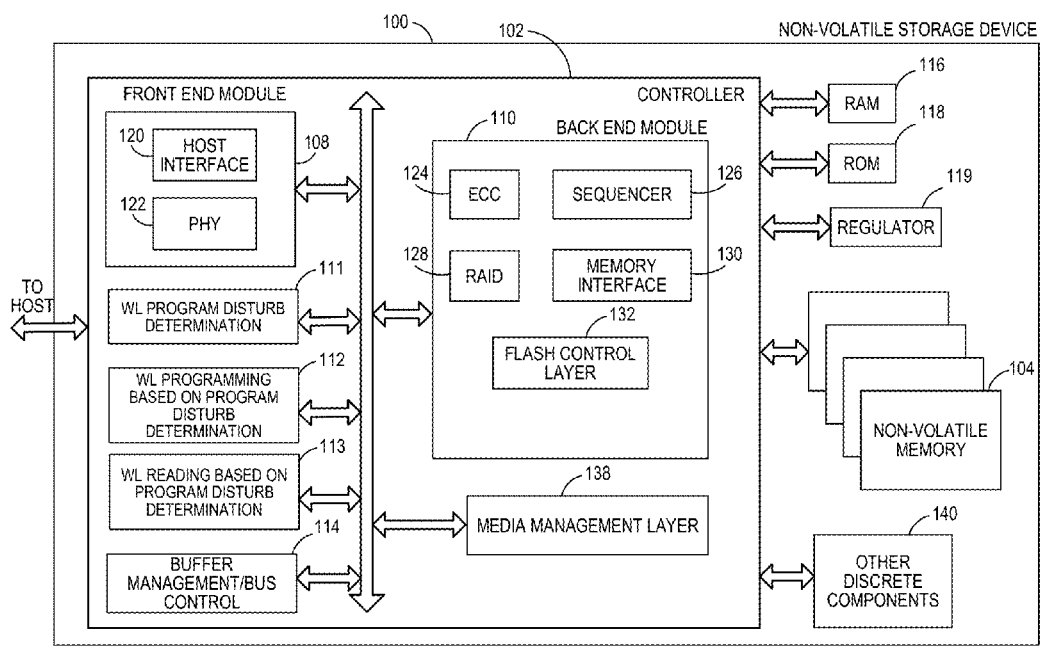
FIG. 2A is a block diagram illustrating one example of exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include a wordline program disturb determination 111, a wordline programming based on the program disturb determination 112, and a wordline reading based on the program disturb determination 113. Alternatively, the controller 102 may be represented by various circuitry, such as wordline program disturb circuitry, a wordline programming based on the program disturb determination circuitry, and a wordline reading based on the program disturb determination circuitry. In one embodiment, the circuitry may comprise the controller (or various parts of the controller) 102 in combination with execution of code or software to implement the associated functionality. Alternatively, the circuitry may be represented by programmable logic arrays or the like.

As explained in more detail below, the controller 102 may determine an indication of program disturb. In one embodiment, the determination of program disturb may be at the wordline level. Further, in one embodiment, the determination of the indication may be performed in real-time. In particular, the analysis of a state of the wordline (e.g., the true erase state) may be performed in response to a determination to write data to the wordline. Alternatively, the determination of the indication may be performed based on previous analysis (e.g., a table such as illustrated in FIG. 6).

In this regard, the wordline program disturb determination 111 may comprise accessing a table, using the wordline and block, to determine an indication of program disturb. In a specific implementation, the indication of program disturb may comprise a program voltage (e.g., the program voltage or an offset to the program voltage, such as illustrated in FIG. 6). The wordline programming based on the program disturb determination 112 may use the output of the wordline program disturb determination 111 (e.g., the program voltage) in order to program the wordline, such as illustrated in more detail below. The controller 102 may access the wordline reading based on the program disturb determination 113 in order to read the wordline. As discussed above, the programming of the wordline may be adjusted or modified based on the indication of program disturb. Thus, in reading the wordline, the adjusted programming may be used to interpret the data read from the wordline.

While in some implementations the wordline program disturb determination 111, the wordline programming based on the program disturb determination 112, and the wordline reading based on the program disturb determination 113 may be part of the controller 102, in other implementations, all or a portion of the wordline program disturb determination 111, the wordline programming based on the program disturb determination 112, and the wordline reading based on the program disturb determination 113 may be discrete components, separate from the controller 102, that interface with the controller 102.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, eMMC I/F, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102.

In alternative embodiments, one or more of the physical layer interface 122, RAID module 128, media management layer 138 and buffer management/bus controller 114 are optional components that are not necessary in the controller 102.

Figure 2B:
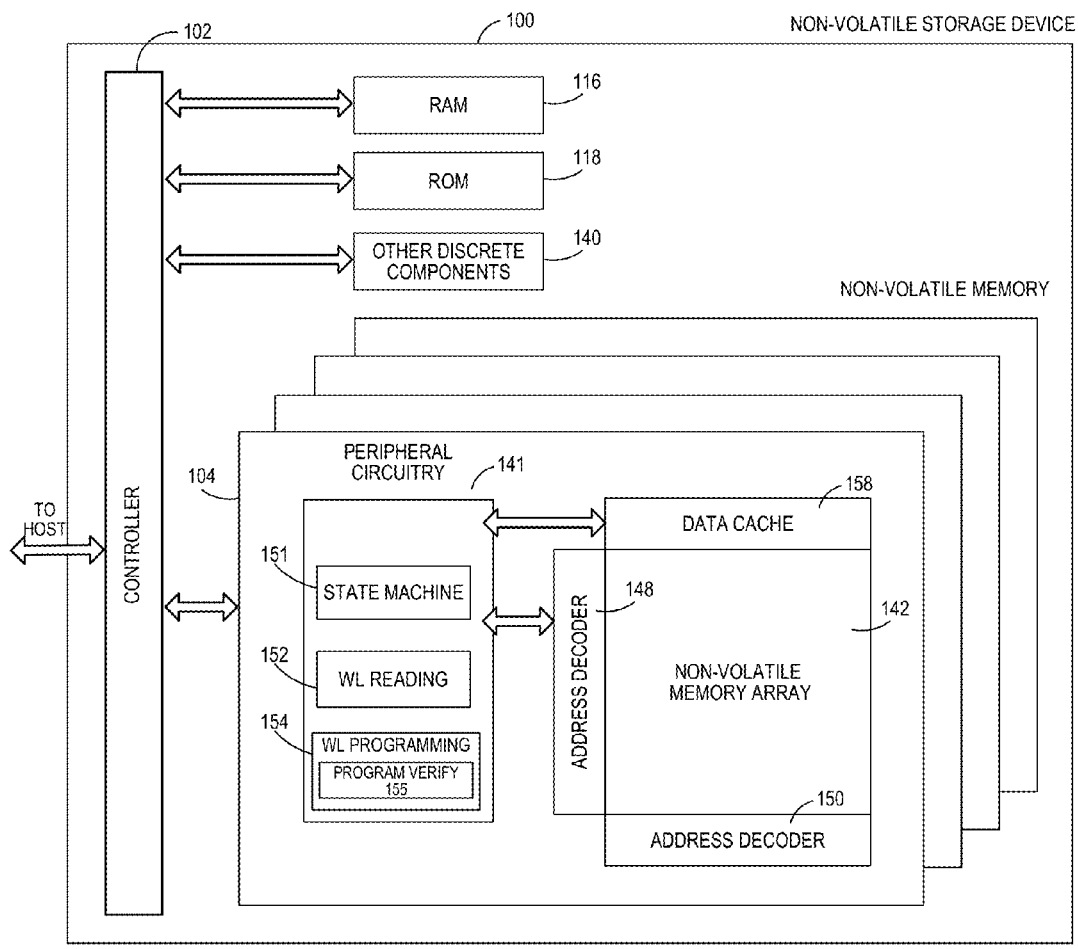
FIG. 2B is a block diagram illustrating exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 151 that provides status information to controller 102.

Non-volatile memory die 104 may further include wordline reading module 152 configured to read a respective wordline in non-volatile memory array 142. Likewise, non-volatile memory die 104 may further include wordline programming module 154 configured to program a respective wordline in non-volatile memory array 142. Wordline programming module may include a program verify module 155. Program verify module 155 may include program verify functionality, such as discussed in more detail below.

Non-volatile memory die 104 further includes address decoders 148, 150 for addressing within non-volatile memory array 142, and a data cache 156 that caches data.

Figure 2C:
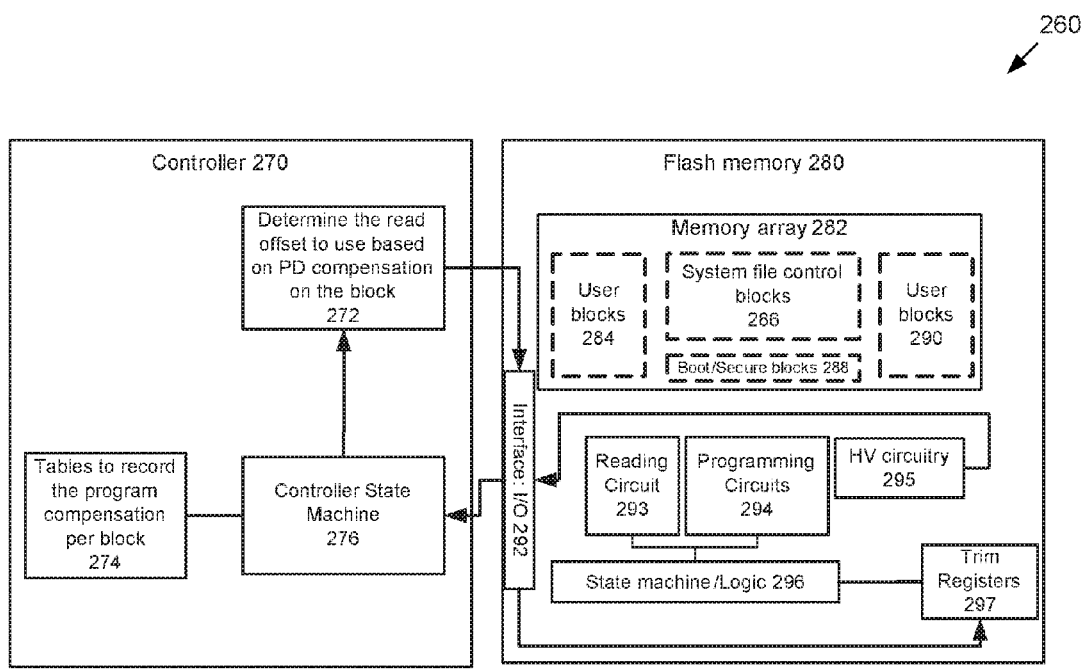
FIG. 2C is a block diagram illustrating another example of exemplary components of a controller of a flash memory system.

FIG. 2C is a block diagram illustrating another example of exemplary components of a controller 270 of a flash memory system 260. The controller 270 includes a controller state machine 276, which is configured to determine the state of controller 270, such as whether the controller 270 is in the write state or the read state. In the write state, the controller state machine 276 is configured to access tables in order to determine the program verify (PGMV) voltage levels to record the program compensation block 274. Alternatively or in addition, when the controller state machine 276 may build part or all of the tables to record the program compensation block 274 (including the program verify voltage levels). The building of the tables may be based on analysis of the erase state of cell(s) within a respective wordline. Thus, the controller state machine 276 may perform program disturb compensation by determining the selection of the PGMV. Further, the controller state machine 276 may access determine the read offset to use based on program disturb compensation of the block 272 in order to determine the read offset.

FIG. 2C further illustrates flash memory 280. Interface I/O 292 is configured to communicate with controller 270. Further, memory array 282 includes various sections of memory, such as user blocks 284 and 290, system file control blocks 286, and boot/secure blocks 288. The blocks illustrated in FIG. 2C are merely for purposes of example. Other types of blocks are contemplated.

Flash memory further includes high voltage (HV) circuitry that includes high voltage pumps for programming wordlines in flash memory 280. Trim registers 297 may be used to alter the programming of the wordlines. In particular, the PGMV may be stored in trim registers 297. In practice, state machine/logic 296 identifies the change in trim registers 297, and using programming circuits 294, uses the identified change to modify programming of the wordlines. In particular, the programming circuits 294 may include program verify functionality, discussed below, in order to verify the voltages programmed on the wordlines. Further, reading circuit 293 may use the read offset in order to read data from the wordlines.

Figure 3:
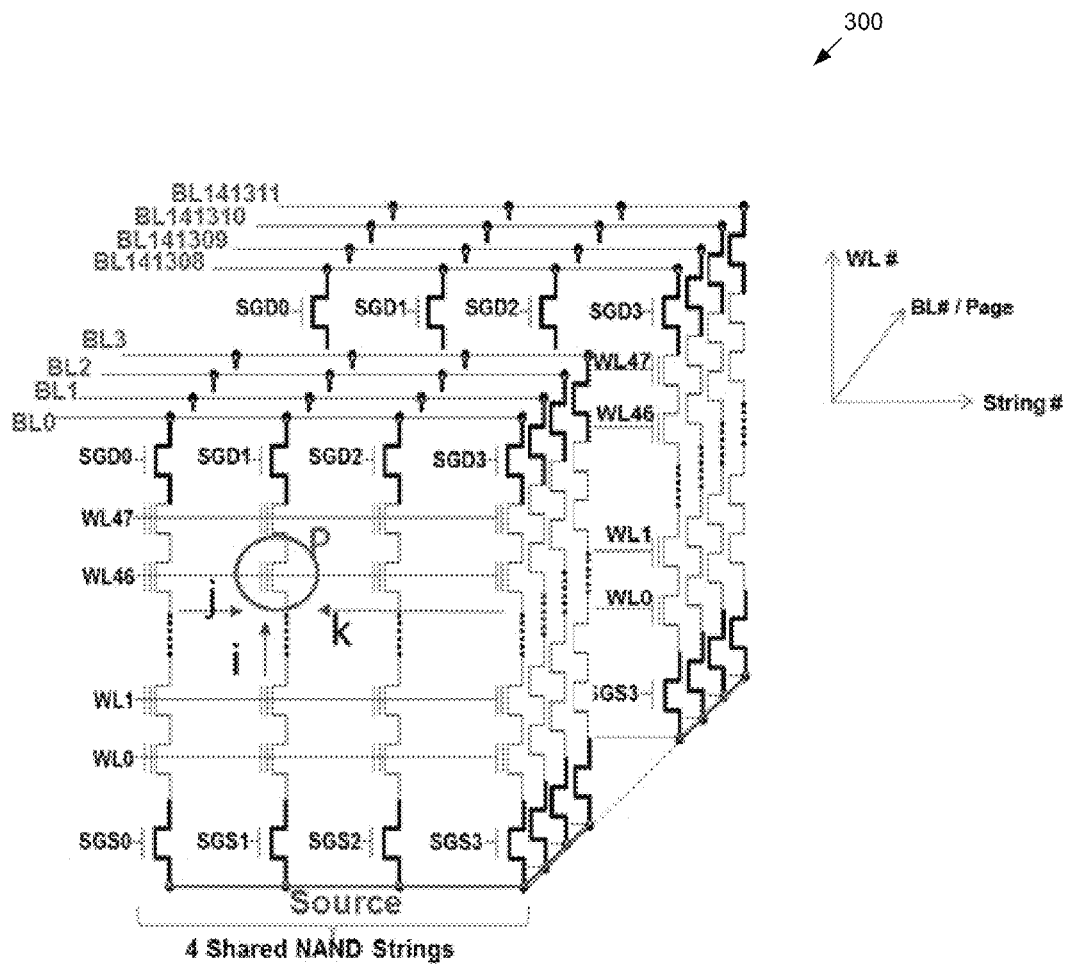
FIG. 3 illustrates a schematic of 3-dimensional memory and indicating disturbance to cell P.

FIG. 3 illustrates a schematic of 3-dimensional memory 300 and indicating disturbance to cell P. In particular, FIG. 3 illustrates multiple wordlines (e.g., WL0 to WL47), multiple strings (e.g., SGS0 to SGS3) and multiple bitlines per page. In practice, there are more program disturbs for the 3D NAND flash illustrated in FIG. 3 than in a 2D due to string based architecture. The program disturb may manifest in Vt shifts. In turn, this may lead to an increase in the system bit error rate when the temperatures at program and the temperature at read are very different.

As discussed above, the storage device may program data into memory cells. The memory cells may be programmed to store one bit, or multiple bits, within a respective cell. For example, the memory cells may be operated to store two levels of charge so that a single bit of data is stored in each cell. This is typically referred to as a binary or single level cell (SLC) memory. As another example, the memory cells may be operated to store more than two detectable levels of charge in each charge storage element or region, thereby to store more than one bit of data in each. This latter configuration is referred to as multi-level cell (MLC) memory. In one embodiment, one type of memory cells are used in the memory. Alternatively, both types of memory cells may be used in a memory, for example binary flash memory may be used for caching data and MLC memory may be used for longer term storage.

For example, in an MLC memory cell configured to store 3 bits of information, there are $2^3=8$ possible states necessary to represent the 3 bits. The 8 states (referred to herein as Er, A, B, C, D, E, F, and G, where Er refers to the erase state) are 8 discrete voltage levels ($V_t$) that the cell may be programmed to. The examples of the number of bits per cell stored and the number of states are merely for illustration purposes.

As one example, the Vt may shift due to storage device operations. More specifically, as the storage device is being heavily cycled, program disturb may become increasingly severe. The Vt shift phenomenon may cause the Vt distribution of the states to be slightly widened (e.g., to widen on one or both the right and left tails). This type of Vt shift is typically not a sufficiently severe issue to immediately cause uncorrectable error correction code (UECC), but may cause the fail bit count (FBC) to increase. The increased FBC may have two negative impacts: (1) as FBC increases at the early life, the storage device read performance may be impacted due to longer error correction coding (ECC) decode time; and (2) there may be a higher chance to cause over-detection for system BER, thereby triggering other system level error handling mechanism (such as read scrub/refresh, CVD, EPWR/RBAX recover, etc.) and retarding overall system performance and introducing additional P/E cycles unnecessarily. Further Vt shift may eventually cause UECC as the storage device has tried to reach the maximum endurance.

As discussed above, program verify functionality may be used to verify whether the data programmed into one or more memory cells has been successfully programmed. A program verify test may comprise a read operation in which a verity voltage (Vread) is applied and the current through the cell is compared to verify current of the program verify test (Iverify_set) or a reset verify current of the program verify test (Iverify_reset) to determine whether the set or reset state, respectively, has been reached. Program verify 308 may determine whether the program verify test has been passed. If it is determined that the program verify test has not been passed, in one embodiment, an error may be returned, and in an alternate embodiment, one or more values for the programming parameters may be updated, such as by increasing the voltage magnitude and/or duration and/or the current limit, and the programming may be performed again.

Figure 4A:
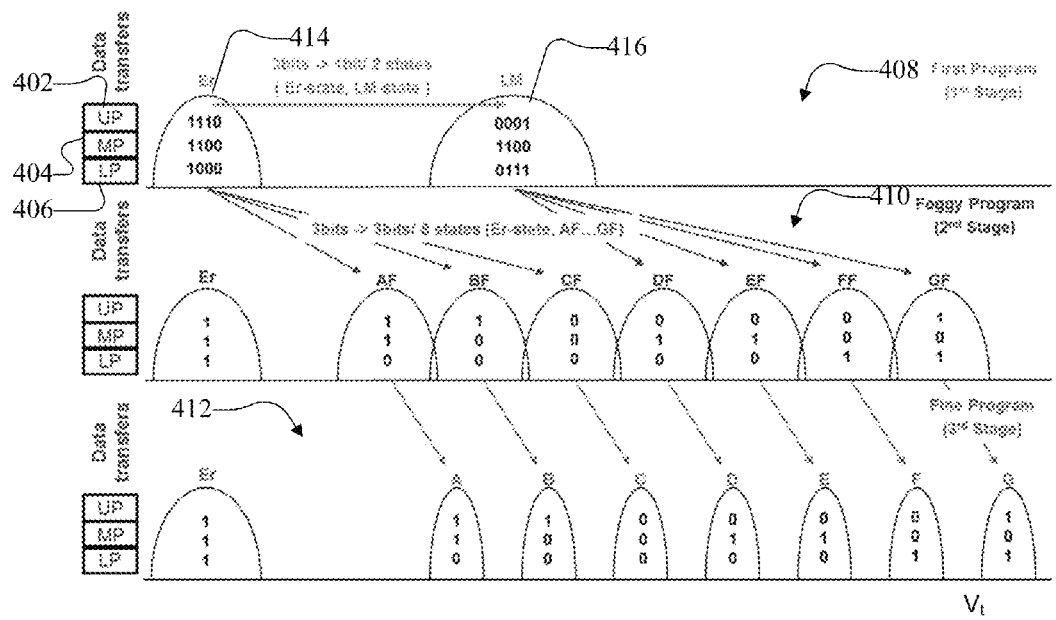
FIG. 4A illustrates an example non-volatile memory programming chart illustrating target voltage levels for each stage of a three stage NAND flash programming operation in a three bit-per-cell memory.

FIG. 4A illustrates programming of a 3-bit-per-cell NAND flash memory without an identified effect from program disturb. The example of FIG. 4A is merely for illustration purposes. Other numbers of bits-per-cell and other types of memory are contemplated. Referring to FIG. 4A, each cell in a WL for a 3 bit-per-cell NAND flash memory may store a bit from each of 3 different pages: an upper page bit (UP) 402 a middle page bit (MP) 404 and a lower page bit (LP) 406. A typical programming operation for such a memory cell would require that the 3 original bits of host data intended for that cell be transferred from the controller to the NAND memory three times, one time for each of three programming passes needed to nudge the correct amount of charge into the cell to reach the desired voltage state without overshooting the desired voltage state.

As indicated in FIG. 4A, the three programming passes or states may be referred to herein as the first programming pass 408, the foggy programming pass 410 and the fine programming pass 412, respectively. Generally speaking, the first programming pass 408 will be a cruder voltage pulse that leaves the stored voltage at either an Erased (Er) 414 level or an intermediate level (LM 416 in FIG. 4A) where the Er voltage level permits subsequent continued programming into one of the first 4 of the 8 desired voltage states (Er, A, B or C) and the LM voltage level pushes the voltage to a threshold that can be increased to one of the latter 4 of the 8 desired voltage states (D, E, F or G).

In a typical first/foggy/fine programming scheme in the memory such as illustrated in FIG. 4A, the original 3 host bits are repeatedly sent from the controller to the NAND to perform each of the three programming stages. Thus, in the second or "foggy" programming step the UP, MP, and LP data are again sent from controller to NAND memory. The UP, MP and LP bits are used by the non-volatile memory (e.g. NAND flash) to generate the foggy programming stage voltage pulses needed to push the current state (Er or LM) achieved in the first programming step 408 to a more resolved 1 of the 8 desired states. The hypothetical voltage distribution options, along with the associated state of the 3 page bits at that voltage level, after foggy programming 410 are shown in FIG. 4A. After the second round of transmitting the original 3 bits of data to NAND memory and carrying out the second, or foggy, programming stage 410, the original three bits are again retrieved from RAM in the controller and sent to the NAND to provide the last, or fine, programming steps 412 necessary to achieve the desired 1 of the 8 states. A distribution for the possible programming voltages achieved after the fine programming stage 412 are shown after in FIG. 4A, where the 8 possible states are shown fully restored.

After applying the programming voltage, the program verify functionality may use a set of predetermined voltages to determine whether the cell has been properly programmed. For exemplary purposes, the verify voltage levels for the 3-bit-per cell NAND flash memory, from A to G, may comprise 0.8, 1.6, 2.4, 3.2, 4.0, 4.8, 5.6V. In the event that the program verify fails, the initial programming voltage may be increased (e.g., by 40 mV), and the process may be repeated. In one embodiment, the number of repeats of the process may be limited to a predetermined number. After which, the memory chip may report a failure to the memory system controller, as discussed in more detail below. This process may be repeated for each of states A through G.

Figure 4B:
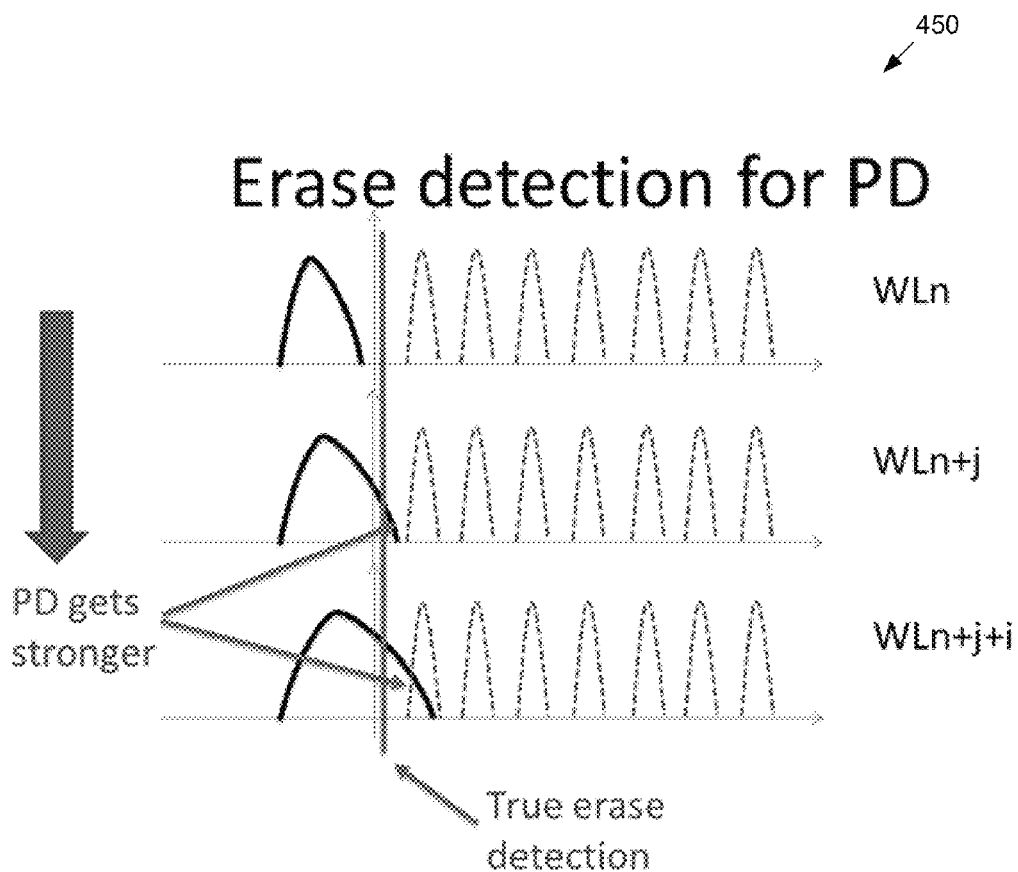
FIG. 4B illustrates program disturb effects and true erase detection for different wordlines in a block.

FIG. 4B illustrates program disturb effects 450 and true erase detection for different wordlines in a block. In particular, FIG. 4B illustrates the Erase state (Er) and states A to G for different wordlines including WLn, WLn+j and WLn+j+i. Thus, FIG. 4B illustrates the states for wordlines of increasing number. WLn illustrates little to no program disturb, and thus is akin to that depicted in FIG. 4A. WLn+j illustrates some program disturb (shown as the erase state) as crossing past the true erase detection line. WLn+j+i illustrates more program disturb (shown as the erase state) as the tail for the erase state crossing into state A. Thus, the program disturb gets stronger as the wordline number increases.

As discussed above, the controller may determine an indication of program disturb. In one way, the controller may analyze one or more aspects of the wordline. In one embodiment, the controller may analyze the erase state. In one example, the controller may use a direct memory count (DMC) function for a true erase check. In particular, the DMC function may count the number of bits above the read voltage level (illustrated as the true erase detection line in FIG. 4B). In this regard, the DMC function may determine how many bits for a respective wordline are to the left and right of the "true erase detection" line. If the number of bits detected to the right of the "true erase detection" line is above a predetermined amount, this is an indication that the tail of the erase state is encroaching (or has encroached) into state A. This is illustrated in wordline WLn+j+i of FIG. 4B. States A to G are illustrated as typically programmed with the PGMV voltage levels. With the typical programming, the right tail of the erase state overlaps state A. In this way, using the typical programming will cause potential errors.

Figure 5:
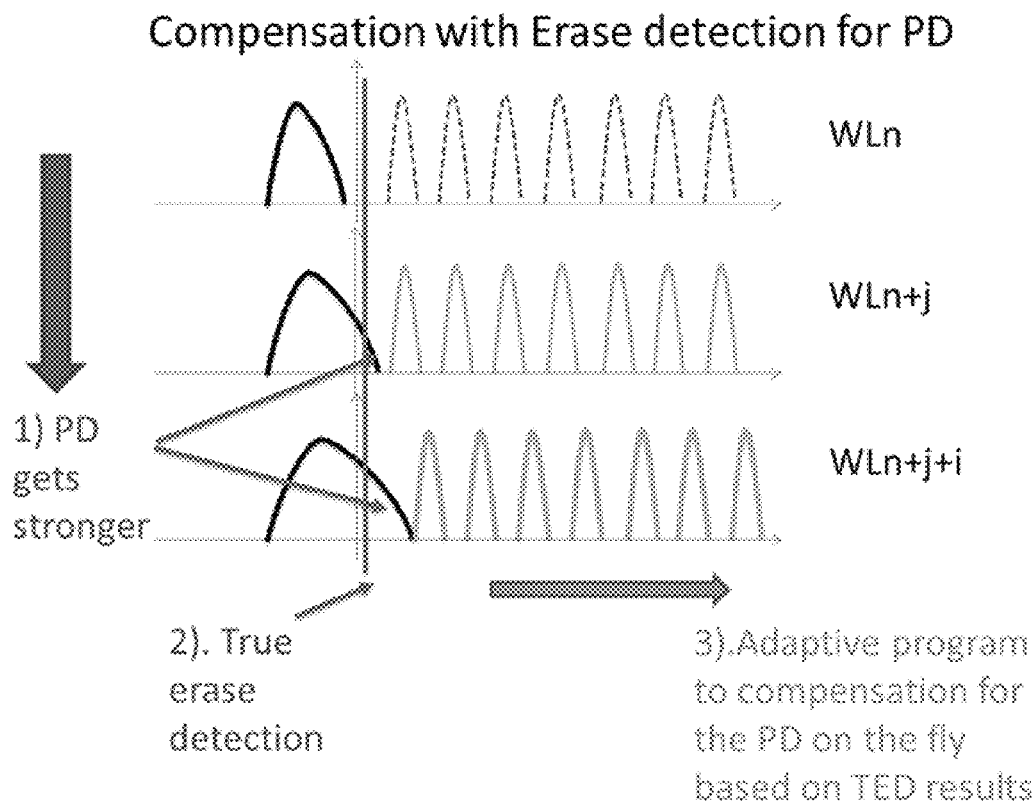
FIG. 5 illustrates adaptive program compensation for program disturb identified based on erase detection.

In order to reduce the effect of program disturb, the programming voltages for the different states (e.g., states A to G) are modified. This is illustrated in FIG. 5, with adaptive program compensation for program disturb identified based on erase detection. As shown for wordline WLn+j+i, the programming is adapted to compensate for program disturb based on the true erase detection results. In this way, the right tail of the erase state does not overlap with any other state (including state A).

As discussed in more detail below, the different state(s) are shifted based on modifying the PGMV. For example, in one embodiment, all of the states (other than the erase state) are shifted. For example, states A to G (except for the Er) are shifted, as shown in FIG. 5 for wordline WLn+j+i. Alternatively, fewer than all of the states (other than the erase state) are shifted. For example, states A to F may be shifted but states G and Er are not.

In addition, in one embodiment, the shift to the right of states A to G is uniform (e.g., the voltage offset from the typical programming voltage is the same for each of states A to G, as illustrated in FIG. 6). Alternatively, the voltage offset from the typical programming voltages may vary for different states. It is also noted that due to the less effects of program disturb on wordlines WLn and WLn+j, states A to G are programmed with the typical PGMV voltage levels.

FIG. 6 illustrates a table 600 of program disturb compensation correlated between blocks and wordlines within respective blocks. As discussed above, in response to a trigger, the controller may populate a table 600 for later reference. The table 600 may correlate blocks (e.g., blocks 0 to 4) to different wordline zones (e.g., different wordline groupings). Though only 5 blocks are illustrated in FIG. 6, in one embodiment, each of the blocks may be included in the table. Alternatively, fewer than all of the blocks may be included in the table. For example, there may be 100 wordlines. In this regard, the wordlines may be subdivided into different zones, such as the five zones illustrated in FIG. 6. For example, zone 0 may include wordlines 0-19, zone 1 may include wordlines 20-39, etc. Further, in one embodiment, each memory die may include a corresponding table. Alternatively, a single table may be used for multiple memory dies.

In populating the table, the controller may analyze one or more wordlines. In the example table in FIG. 6, the controller may analyze one wordline within a zone and determine the offset. In one embodiment, the highest number wordline in the zone may be analyzed to determine program disturb for the zone since effects of program disturb increase as the wordline number increases. For example, for block 0, zone 0 (covering wordlines 0-19 of block 0), the controller may analyze wordline 19 in the erase state for program disturb (e.g., using the DMC function discussed above). As shown in FIG. 6, the program disturb in block 0, zone 0 is negligible, leading to 0 offset on the PGMV. As another example, in block 1, zone 4, the controller may test wordline 127 (the last wordline), determining that an offset of 9 in DAC, with each DAC=12.5 mV. Thus, for block 1, zone 4, the offset for program verification is equal to 112.5 mV. As shown, the higher program disturb, the higher the PGMV voltage levels.

Figure 7:
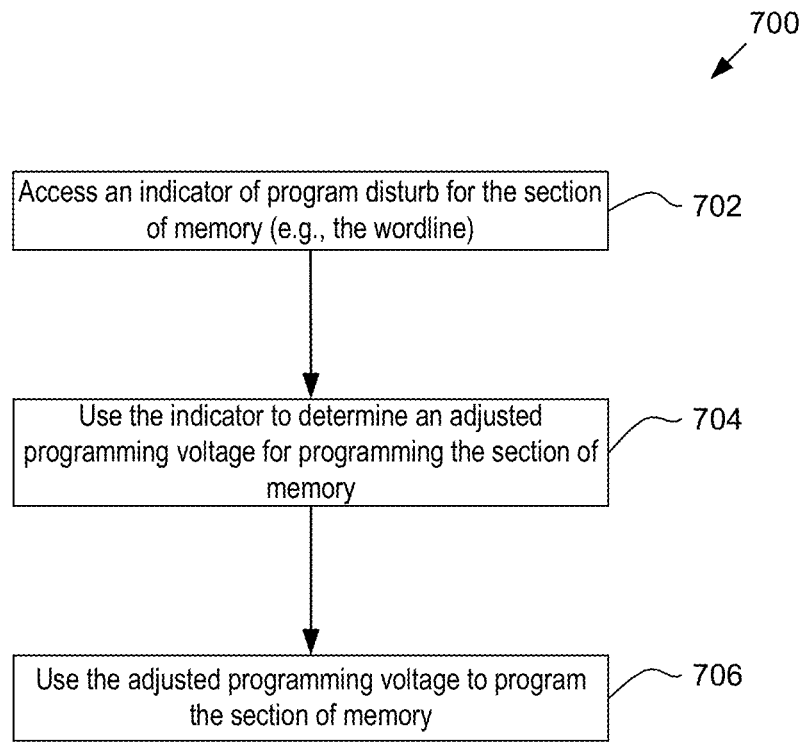
FIG. 7 is a flow chart of one example of programming a section of memory based on an indicator of the program disturb for the section of memory.

FIG. 7 is a flow chart 700 of one example of programming a section of memory based on an indicator of the program disturb for the section of memory. At 702, the controller access an indicator of program disturb for the section of memory (such as a wordline or a group of wordlines). An example of the indicator may comprise the offsets illustrated in FIG. 6. Other indicators are contemplated. At 704, the indicator is used to determine the adjusted programming voltage for programming the section of memory. For example, the offset may be used to modify the typical programming voltage in order to generate the adjusted programming voltage for programming. Alternatively, the table may correlate blocks/wordlines to adjusted programming voltages. In this regard, there may be a direct correlation between blocks/wordlines to adjusted programming voltage without accessing an indicator (such as a programming offset) and accessing the typical programming voltage in order to determine the adjusted programming voltage. At 706, the adjusted programming voltage is used to program the section of memory.

Figure 8:
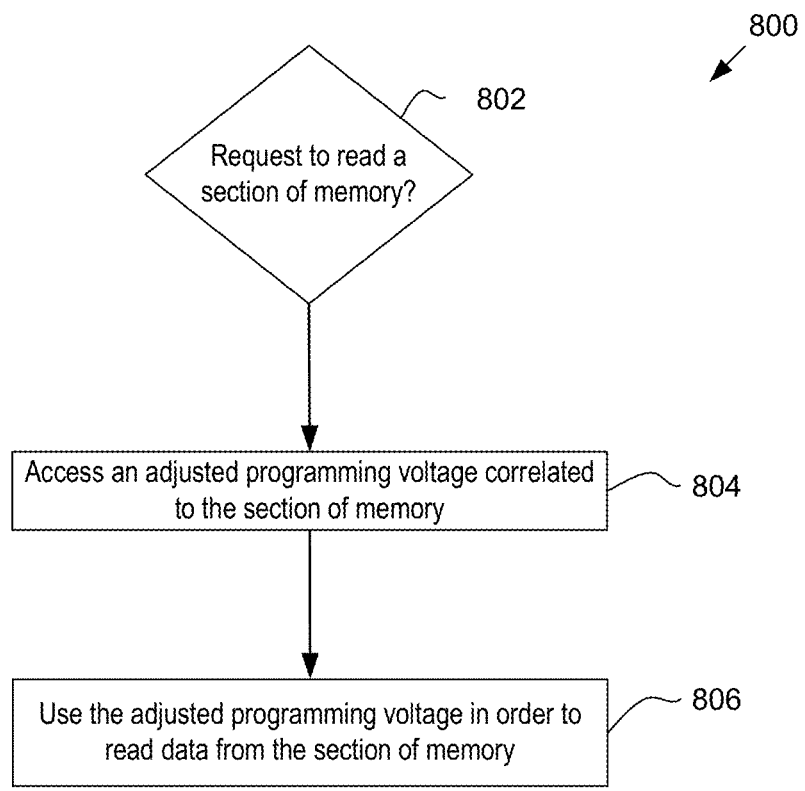
FIG. 8 is a flow chart of one example of reading a section of memory based on an indicator of the program disturb for the section of memory.

FIG. 8 is a flow chart 800 of one example of reading a section of memory based on an indicator of the program disturb for the section of memory. At 802, it is determined whether to request a read of a section of memory. If so, at 804, an adjusted programming voltage, correlated to the section of memory, may be accessed. For example, a table may be accessed which correlates block/wordlines to adjusted programming voltages. In particular, the adjusted programming voltages for the different states (such as states Er, A to G) may be determined. Alternatively, in response to requesting a read of a wordline in memory, the table depicted in FIG. 6 may be accessed. In this regard, an indicator (such as the offset on the PGMV) and the typical (unadjusted) programming voltages may be accessed. Combining the indicator and the typical programming voltages may in turn determine the adjusted programming voltages. At 806, the adjusted programming voltage may be used in order to read the data. In particular, the adjusted programming voltages may be used to determine whether data is stored in the different states.

Figure 9:
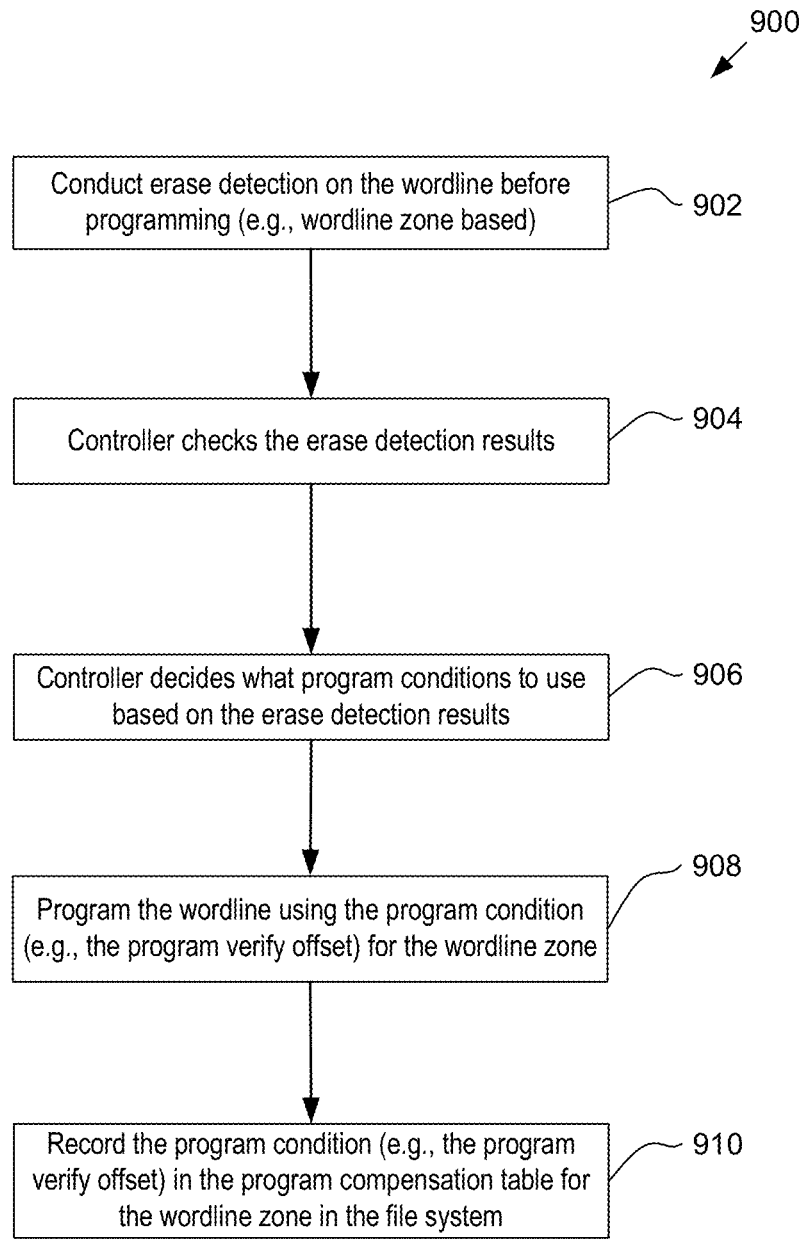
FIG. 9 is a flow chart of another example of programming a section of memory based on an indicator of the program disturb for the section of memory.

FIG. 9 is a flow chart 900 of another example of programming a section of memory based on an indicator of the program disturb for the section of memory. At 902, erase detection is conducted on the wordline before programming. As discussed above, one example of erase detection is analyzing the erase state Er using the DMC function discussed above. At 904, the controller checks the erase detection results. For example, the controller may determine whether the erase detection results indicate program disturb in the wordline under analysis. At 906, based on the erase detection results, the controller may determine what program conditions to use. For example the controller may determine the adjusted programming voltage. At 908, the wordline may be programmed using the program condition. At 910, the program condition may be recorded in the program compensation table (such as illustrated in FIG. 6).

Figure 10:
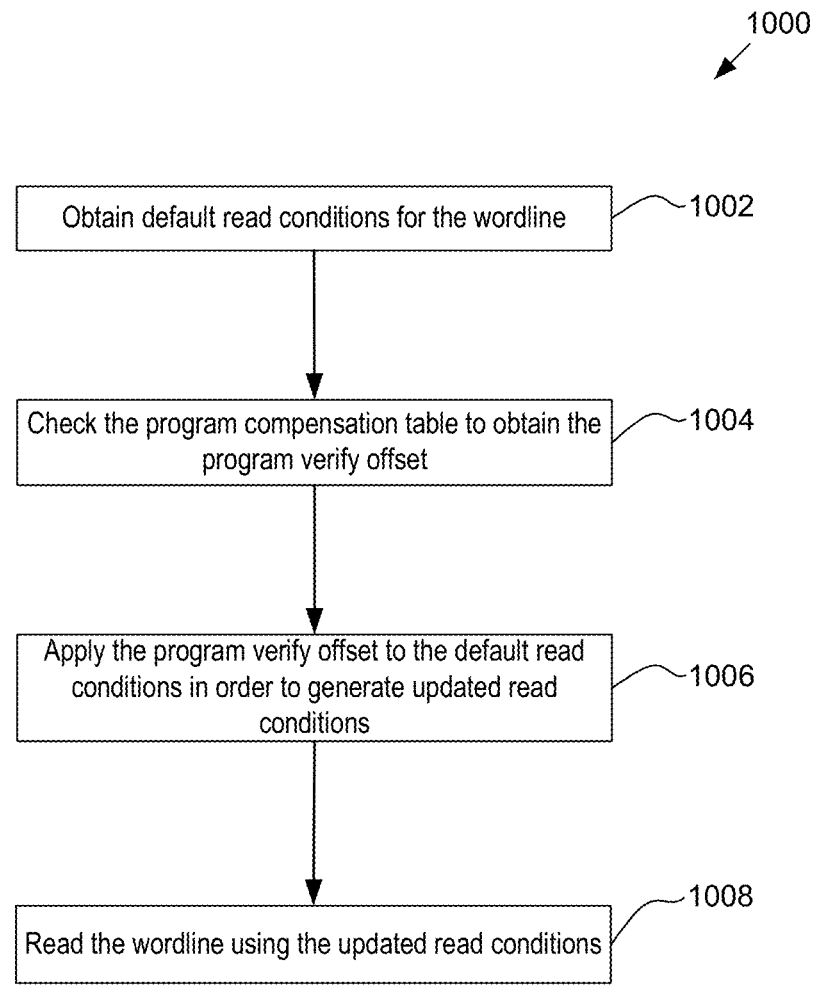
FIG. 10 is a flow chart of another example of reading a section of memory based on an indicator of the program disturb for the section of memory.

FIG. 10 is a flow chart 1000 of another example of reading a section of memory based on an indicator of the program disturb for the section of memory. At 1002, the default read conditions for the wordline are obtained. For example, the default read conditions for the different states (e.g., the voltages at Er, states A to G without any adjustment for program disturb). At 1004, the program compensation table (such as populated at 910 and illustrated in FIG. 6) may be accessed to obtain the program verify offset. At 1006, the program verify offset is applied to the default read conditions in order to generate the updated read conditions. At 1008, the wordline is then read using the updated read conditions.

In the present application, semiconductor memory systems such as those described in the present application may include volatile memory systems, such as dynamic random access memory ("DRAM") or static random access memory ("SRAM") devices, non-volatile memory systems, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory system may have different configurations. For example, flash memory systems may be configured in a NAND or a NOR configuration.

The memory systems can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory system elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory systems in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory system level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory system level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory system levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory system levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory system levels. Alternatively, the memory elements may be coupled together to form a vertical NAND string that traverses across multiple horizontal memory system levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory system levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory system level of the array are typically formed on the layers of the underlying memory system levels of the array. However, layers of adjacent memory system levels of a monolithic three dimensional memory array may be shared or have intervening layers between memory system levels.

Then again, two dimensional arrays may be formed separately and then packaged together to form a non-monolithic memory system having multiple layers of memory. For example, non-monolithic stacked memories can be constructed by forming memory levels on separate substrates and then stacking the memory levels atop each other. The substrates may be thinned or removed from the memory system levels before stacking, but as the memory system levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory system.

Associated circuitry is typically required for operation of the memory elements and for communication with the memory elements. As non-limiting examples, memory systems may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for operating a storage device comprising:
   determining to program multiple bits into cells of a section of memory, the multiple bits being represented by at least an erase state, a first programmed state and a second programmed state, wherein the first programmed state and the second programmed state are different from the erase state;
   determining an indication of program disturb in the section of memory in the storage device;
   determining, based on the indication, an adjusted programming voltage for programming the second programmed state in the section of memory, the adjusted programming voltage for programming the second programmed state being offset from a programming voltage for programming the second programmed state in an absence of detectable program disturb in the section of memory;
   determining a programming voltage for programming the first programmed state in the section of memory in the absence of detectable program disturb in the section of memory;
   programming data into the section of memory based on the determined adjusted programming voltage for programming the second programmed state and based on the determined programming voltage for programming the first programmed state; and
   responsive to a command to read part or all of the data programmed into the section of memory, reading, using a read voltage adjusted based on the determined adjusted programming voltage for programming the second programming state and the determined programming voltage for programming the first programming state, the data from the section of memory.

2. The method of claim 1, wherein determining the indication of program disturb comprises accessing a table correlating respective sections of memory with respective indications of program disturb.

3. A method for operating a storage device comprising:
   accessing a table comprises entries correlating groups of blocks to groups of wordlines, wherein a first correlated program disturb for a group of blocks to a first group of wordlines comprises no indication of program disturb and wherein a second correlated program disturb for the first correlated group of blocks to a second group of wordlines comprises an indication of program disturb;
   determining programming voltages in an absence of detectable program disturb for programming the first group of wordlines;
   determining, based on the indication of program disturb, adjusted programming voltages for programming the second group of wordlines in the group of blocks of memory, the adjusted programming voltages being different from the programming voltages in the absence of detectable program disturb in the group of blocks of memory;
   programming data into the first group of wordlines and second group of wordlines in a block of memory based on the programming voltages and the adjusted programming voltages, respectively; and
   responsive to a command to read part or all of the data programmed into the first group of wordlines and second group of wordlines of the block of memory, reading, based on the programming voltages and the adjusted programming voltages, respectively, the data from the first group of wordlines and second group of wordlines in the block of memory.

4. The method of claim 1, wherein the indication of program disturb comprises an offset voltage, the offset voltage comprising an offset to the programming voltage for programming the second programmed state in the absence of detectable program disturb in the section of memory; and
   wherein determining the adjusted programming voltage for programming the second programmed state in the section of memory comprises adding the offset voltage to the programming voltage for programming the second programmed state in the absence of detectable program disturb in the section of memory.

5. The method of claim 1, wherein the indication of program disturb is based on an analysis of the erase state for one or more cells in the section of memory.

6. The method of claim 5, wherein determining the indication of program disturb comprises:
   counting a number of bits in the cells of a wordline in the erase state that are greater than a predetermined threshold; and
   based on the number of bits greater than the predetermined threshold, determining the indication of program disturb.

7. The method of claim 1, further comprising, responsive to receipt of the command to read part or all of the data programmed into the section of memory, accessing the determined adjusted programming voltage from a table.

8. A storage device comprising:
   erase state analysis circuitry configured to analyze an erase state of at least a part of a wordline in the storage device in order to determine an indication of program disturb in the at least a part of the wordline, wherein the wordline has multiple bits therein being represented by at least an erase state, a first programmed state and a second programmed state;
   programming determination circuitry configured to determine programming voltages for programming multiple bits into the storage device, the programming determination circuitry configured to determine:
      a programming voltage for programming the first programmed state in the section of memory in the absence of detectable program disturb in the section of memory; and
      an adjusted programming voltage, based on the determined indication of the program disturb, for programming the second programmed state, the adjusted programming voltage being offset from programming the second programming state in an absence of the indication of program disturb;
   programming circuitry configured to program the wordline based on the programming voltage for programming the first programmed state and the adjusted programming voltage for programming the second programmed state; and
   read circuitry configured to read using a read voltage based on the determined programming voltage for programming the first programmed state and the adjusted programming voltage for programming the second programmed state.

9. The storage device of claim 8, wherein the erase state analysis circuitry is configured to:
   count a number of bits in cells of the wordline in the erase state that are greater than a predetermined threshold; and
   based on the number of bits greater than the predetermined threshold, determine the indication of program disturb.

10. A storage device comprising:
    erase state analysis circuitry configured to analyze an erase state of at least a part of memory in the storage device in order to determine an indication of program disturb in the at least a part of the memory;
    programming adjustment circuitry configured to adjust program verify voltage levels, based on the determined indication of the program disturb, for all of a plurality of states except for an erase state;
    programming circuitry configured to program the part of memory based on the adjusted program verify voltage levels for all of the plurality of states except for the erase state; and
    read circuitry configured to read using a read voltage adjusted based on the adjusted program verify voltage levels.

11. A storage device comprising:
    a memory; and
    a controller in communication with the memory, the controller configured to:
       determine to program multiple bits of data in cells in a section of memory, the multiple bits of data being represented by an erase state and additional states;
       determine program disturb for the section of the memory;
       adjust program verify voltage levels for each of the additional states based on the determined program disturb without adjusting the erase state;
       program, using the adjusted program verify voltage levels for each of the additional states without adjusting the erase state, data in the section of the memory; and
       read, using a read voltage based on the program verify voltage levels for each of the additional states without adjusting the erase state, the data from the section of memory.

12. The storage device of claim 11, wherein the controller is configured to determine the program disturb for a section of the memory by accessing a table, the table indicative of previous analysis of the section of memory for the program disturb.

13. The storage device of claim 11, wherein the controller is configured to determine the program disturb for a section of the memory by analyzing a state of the section of memory.

14. The storage device of claim 13, wherein the state comprises the erase state of one or more cells in the section of memory.

15. The storage device of claim 13, wherein the controller is configured to analyze the state of the section of memory by comparing the state of the section of memory against a predetermined voltage; and
    wherein the controller is configured to adjust programming of the section of the memory based on the comparison.

16. The method of claim 3, wherein the indication of program disturb comprises a first indication of program disturb and a second indication of program disturb;
    wherein the first indication of program disturb is used to determine a first voltage offset voltage indicative of a difference from program voltage verification absent the program disturb;
    wherein the second indication of program disturb is used to determine a second voltage offset voltage indicative of a difference from program voltage verification absent the program disturb; and
    wherein the first voltage offset is different from the second voltage offset.

17. The method of claim 3, wherein the table correlates blocks in the storage device with wordlines within respective blocks.

18. The method of claim 3, wherein a highest wordline in a respective group of the wordlines is analyzed to determine a voltage offset for programming the respective group of the wordlines.

19. The method of claim 3, wherein the first group of wordlines includes wordline 0.

20. The storage device of claim 11, wherein the adjust program verify voltage levels for each of the additional states are uniformly adjusted.

21. The storage device of claim 11, wherein the adjust program verify voltage levels for each of the additional states are non-uniformly adjusted.

\* \* \* \* \*

UNITED STATES PATENT AND TRADEMARK OFFICE
CERTIFICATE OF CORRECTION

PATENT NO. : 9,792,998 B1
APPLICATION NO. : 15/084100
DATED : October 17, 2017
INVENTOR(S) : Nian Niles Yang et al.

It is certified that error appears in the above-identified patent and that said Letters Patent is hereby corrected as shown below:

On the Title Page

Left column, insert item (65), as follows:
-- Prior Publication Data
US 2017/0287568 A1   October 5, 2017 --.

Signed and Sealed this
Tenth Day of July, 2018

Andrei Iancu
*Director of the United States Patent and Trademark Office*